United States Patent
Shin et al.

(10) Patent No.: US 7,732,311 B2
(45) Date of Patent: Jun. 8, 2010

(54) METHODS OF MANUFACTURING SEMICONDUCTOR DEVICES

(75) Inventors: Dong-Suk Shin, Yongin-si (KR); Joo-Won Lee, Suwon-si (KR); Tae-Gyun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 12/213,502

(22) Filed: Jun. 20, 2008

(65) Prior Publication Data

US 2009/0004800 A1    Jan. 1, 2009

(30) Foreign Application Priority Data

Jun. 29, 2007    (KR) .................... 10-2007-0064941

(51) Int. Cl.
- H01L 21/336 (2006.01)
- H01L 21/26 (2006.01)
- H01L 21/22 (2006.01)
- H01L 21/38 (2006.01)
- H01L 21/44 (2006.01)

(52) U.S. Cl. .................. 438/559; 438/535; 438/303; 438/597; 257/E21.149

(58) Field of Classification Search ............... 438/303, 438/535, 559, 597; 257/E21.149
See application file for complete search history.

(56) References Cited

U.S. PATENT DOCUMENTS

| 6,323,519 B1 * | 11/2001 | Gardner et al. ............... 257/336 |
| 6,534,388 B1 * | 3/2003 | Lin et al. .................... 438/510 |
| 2005/0181591 A1 * | 8/2005 | Tsuno ........................ 438/597 |

FOREIGN PATENT DOCUMENTS

| KR | 10-0361576 | 11/2002 |
| KR | 0668954 | 1/2007 |

* cited by examiner

*Primary Examiner*—Alexander G Ghyka
*Assistant Examiner*—Seahvosh J Nikmanesh
(74) *Attorney, Agent, or Firm*—Harness, Dickey & Pierce, P.L.C.

(57) ABSTRACT

In a method of manufacturing a semiconductor device, a conductive layer pattern may be formed on a substrate. An oxide layer may be formed on the substrate to cover the conductive layer pattern. A diffusion barrier layer may be formed by treating the oxide layer to increase an energy required for a diffusion of impurities. An impurity region may be formed on the substrate by implanting impurities into the conductive layer pattern and a portion of the substrate adjacent to the conductive layer pattern, through the diffusion barrier. The impurities in the conductive layer pattern and the impurity region may be prevented or reduced from diffusing, and therefore, the semiconductor device may have improved performance.

18 Claims, 6 Drawing Sheets

METHODS OF MANUFACTURING SEMICONDUCTOR DEVICES

PRIORITY STATEMENT

This application claims priority under 35 U.S.C. §119 to Korean Patent Application No. 2007-0064941, filed on Jun. 29, 2007, in the Korean Intellectual Property Office (KIPO), the entire contents of which are herein incorporated by reference.

BACKGROUND

1. Field

Example embodiments relate to methods of manufacturing semiconductor devices. More particularly, example embodiments relate to methods of manufacturing a P type metal oxide semiconductor (PMOS) transistor having improved performance and a complementary metal oxide semiconductor (CMOS) transistor having improved performance.

2. Description of the Related Art

A transistor, e.g., a metal oxide semiconductor field effect transistor (MOSFET), may be a basic unit constituting a semiconductor memory device. The transistor operating at a relatively high speed under a relatively low voltage has been developed to have a minute or smaller size and a higher integration degree.

As the semiconductor memory device has been highly integrated, a size of an active region of a substrate also has been scaled down. Thus, a gate length of the transistor formed in the active region may be shorter. When the gate length of the transistor is reduced, a source/drain may exert great influence upon an electric field or an electric potential in a channel region, so that a switching operation by gate voltage may not be properly performed, which may be called a "short-channel effect". That is, as the gate length has become shortened, the channel region may be influenced by the electric charge, electric field and potential distribution in a depletion layer of a source/drain region in addition to the gate voltage, so that the normal switching operation may be difficult.

In addition, as drain voltage increases, the size of drain depletion layer may also increase, so that the drain depletion layer may approach a source. When the gate length is shortened, the drain depletion layer may be integrally connected to a source depletion layer. In this case, a drain electric filed may exert an influence upon the source, thereby lowering diffusion potential around the source. Thus, current may flow between the source and the drain even if a channel is not formed therebetween, otherwise know as a "punch through phenomenon". If the punch through phenomenon occurs, the drain current may not be saturated, but may increase even in a saturation area.

Such a short channel effect may become severe as a junction depth of the source/drain region increases or a channel doping lowers. In order to reduce the short channel effect, the source/drain may have a shallow junction depth. However, if the source/drain has the shallow junction depth, source/drain resistance may increase.

In addition, a source/drain having a lightly doped drain (LDD) structure has been suggested to prevent or reduce the short channel effect. As semiconductor devices have been highly integrated, various semiconductor manufacturing technologies have been developed. Gate spacers may be formed on both sidewalls of gate electrodes to form an LDD region.

In order to form the source/drain, the source/drain region may be open and source/drain ions may be doped into the source/drain region. A rapid thermal process (RTP) may be performed to activate dopants. When the RTP is performed, impurities may diffuse from the source/drain region in downward, upward, and lateral directions of a substrate. Thus, the interval between the source and the drain may be reduced and impurity concentration in the source/drain region may be lowered, increasing the resistance of the source/drain region. For example, boron (B), which is a P type impurity, may have relatively low diffusion energy, so boron may more easily diffuse onto the substrate, thereby deteriorating the operational characteristics of the transistor.

A gate electrode may include a material having a specific work function to allow the transistor to have a desired threshold voltage. Polysilicon may be used as the gate electrode because the work function of the polysilicon may be properly adjusted according to the conductive type of impurities doped into the polysilicon. In the case of the PMOS transistor, the polysilicon doped with P type impurities, e.g., boron, may be used as the gate electrode. In the case of a N type transistor, the polysilicon doped with N type impurities, e.g., phosphor or arsenic, may be used as the gate electrode. When the polysilicon doped with the impurities is used as the gate electrode, impurity concentration in the gate electrode may be maintained at a predetermined or given level by preventing or reducing impurities from diffusing from the gate electrode. If the impurity concentration in the gate electrode of the PMOS transistor is lowered, a serious gate depletion phenomenon may occur, so that the thickness of a gate oxide layer may be increased, deteriorating the operational characteristics of the transistor.

However, because impurities doped into the source/drain region and the gate electrode continuously diffuse during the thermal processes, reducing the amount of impurity diffusion may be difficult. Because boron used for the PMOS transistor rapidly diffuses as compared with N type impurities, e.g., phosphor or arsenic, the operational characteristics of the PMOS transistor may deteriorate due to the impurity diffusion.

SUMMARY

Example embodiments provide methods of manufacturing semiconductor devices, e.g., PMOS transistors, having improved performance. Example embodiments provide methods of manufacturing semiconductor devices, e.g., CMOS transistors, having improved performance.

According to example embodiments, there may be provided a method of manufacturing a semiconductor device. In the method of manufacturing the semiconductor device, a conductive layer pattern may be formed on a substrate. An oxide layer may be formed on the substrate and the conductive layer pattern. A diffusion barrier layer may be formed by treating the oxide layer to increase an energy required for a diffusion of impurities. An impurity region may be formed on a portion of the substrate by implanting the impurities through the diffusion barrier layer onto the conductive layer pattern and the portion of the substrate adjacent to the conductive layer pattern.

In example embodiments, the diffusion barrier may be formed by a plasma treatment and/or an ultraviolet (UV) light irradiation. The plasma treatment may be performed using a plasma generated by a hydrogen gas, a helium gas, a nitrogen gas, an argon gas, an oxygen gas, and/or an ozone gas. Further, the plasma treatment may be executed at a temperature in a range of about 300° C. to about 700° C. for about 1 minute to about 5 minutes. The UV light irradiation may be carried out at a temperature in a range of about 400° C. to about 600° C. under an inactive gas atmosphere.

In example embodiments, a spacer formation layer may be formed on the diffusion barrier layer, and a spacer may be formed on a portion of the diffusion barrier layer positioned on a sidewall of the conductive layer pattern. The spacer may be formed by anisotropically etching the spacer formation layer using the diffusion barrier layer as an etch stop layer. The diffusion barrier layer and the spacer formation layer may be formed in situ.

In example embodiments, a lightly doped impurity region may be formed on a portion of the substrate by doping P type impurities into the portion of the substrate before forming the oxide layer. In example embodiments, an offset spacer may be formed on the sidewall of the conductive layer pattern to adjust a position of the lightly doped impurity region. In example embodiments, the P type impurities in the impurity region may be activated by thermally treating the substrate having the impurity region.

In example embodiments, the conductive layer pattern may be a first gate structure and a second gate structure in a first region and a second region of the substrate, and the oxide layer may be a silicon oxide layer covering the first and the second gate structures. Implanting the impurities may include forming a first impurity region in the first region of the substrate by implanting N type impurities into the first region of the substrate adjacent to the first gate structure, and forming a second impurity region in the second region of the substrate by implanting P type impurities into the second region of the substrate adjacent to the second gate structure. Before implanting the impurities, spacers may be formed on portions of the diffusion barrier layer positioned on sidewalls of the first and the second gate structures.

According to example embodiments, a semiconductor device may reduce a diffusion of impurities contained in a gate electrode and source/drain regions because of a diffusion barrier layer. Because the diffusion of impurities in the gate electrode and the source/drain regions is effectively prevented or reduced, impurity concentrations in the gate electrode and the source/drain regions may be maintained at relatively high levels. As a result, gate depletion may be restricted and resistances of the source/drain regions may be reduced.

BRIEF DESCRIPTION OF THE DRAWINGS

Example embodiments will be more clearly understood from the following detailed description taken in conjunction with the accompanying drawings.

FIGS. 1 to 7 are cross sectional views illustrating a method of manufacturing a PMOS transistor in accordance with example embodiments;

FIG. 8 is a cross sectional view illustrating a method of manufacturing a semiconductor device in accordance with example embodiments; and FIGS. 9 to 12 are cross sectional views illustrating a method of manufacturing a CMOS transistor in accordance with example embodiments.

Figure 1:
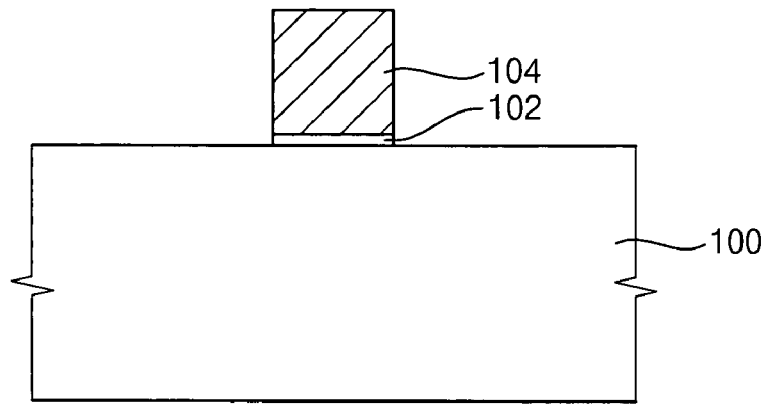
FIGS. 1-12 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments may be described more fully hereinafter with reference to the accompanying drawings, in which example embodiments may be shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 to 7 are cross sectional views illustrating a method of manufacturing a PMOS transistor in accordance with example embodiments. Referring to FIG. 1, a gate insulation layer (not illustrated) and a gate conductive layer (not illustrated) may be sequentially formed on a substrate 100. The substrate 100 may include a semiconductor substrate, e.g., a silicon substrate, a germanium substrate or a silicon-germanium substrate, a silicon on insulator (SOI) substrate, or a germanium on insulator (GOI) substrate.

The gate insulation layer may be formed using silicon oxide by a thermal oxidation process. Alternatively, the gate insulation layer may include a metal oxide having a dielectric constant higher than that of silicon oxide. The gate insulation layer may be formed by a chemical vapor deposition (CVD) process, a plasma enhanced chemical vapor deposition (PECVD) process, or an atomic layer deposition (ALD) process.

The gate conductive layer may be formed using polysilicon doped with impurities. For example, a polysilicon layer may be formed on the gate insulation layer, and P type impurities may be doped into the polysilicon layer, thereby forming the gate conductive layer on the gate insulation layer. Alternatively, the impurities may be doped in the polysilicon layer while depositing the polysilicon layer on the gate insulation layer. The P type impurities in the gate conductive layer may include boron (B). In example embodiments, the gate conductive layer may include a polysilicon layer doped with P type impurities. Alternatively, the gate conductive layer may have a stack structure including a polysilicon layer and a metal layer stacked on the polysilicon layer.

Referring now to FIG. 1, the gate conductive layer and the gate insulation layer may be partially etched to form a gate electrode 104 and a gate insulation layer pattern 102 on the substrate 100. The gate electrode 104 and the gate insulation layer pattern 102 may be formed by a photolithography process. For example, a photoresist pattern or a hard mask may be employed as an etching mask in an etching process for forming the gate electrode 104 and the gate insulation layer pattern 102. The photoresist pattern or the hard mask used as the etching mask may be removed after forming the gate insulation layer pattern 102 and the gate electrode 104.

In example embodiments, the substrate 100 having the gate insulation layer pattern 102 and the gate electrode 104 may be thermally treated to form a re-oxidation layer (not shown) on the substrate 100 and the gate electrode 104. Surfaces of the substrate 100 and the gate electrode 104 may be cured in forming the re-oxidation layer. For example, the re-oxidation layer may have a thickness of about 5 Å to about 30 Å. However, the re-oxidation layer may be omitted to simplify manufacturing processes for the semiconductor device.

Figure 2:
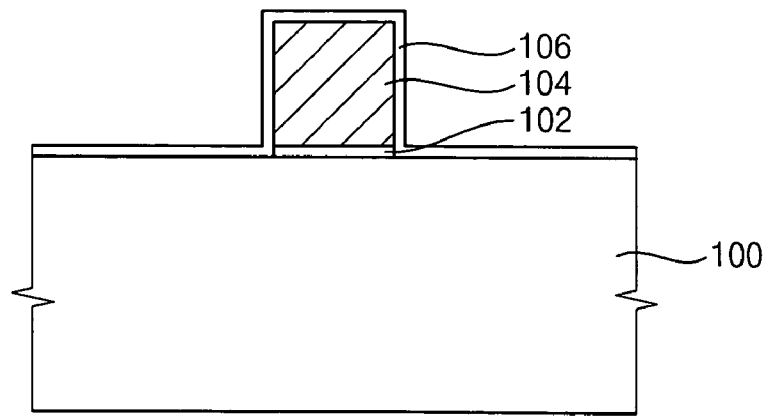

Referring to FIG. 2, a first insulation layer 106 may be formed on the substrate 100 to cover the gate electrode 104. The first insulation layer 106 may further cover a sidewall of the gate insulation layer pattern 102. The first insulation layer 106 may serve as an offset spacer 106a (see FIG. 3) in subsequent processes. For example, edge positions of lightly doped regions in source/drain regions and positions of heavily doped regions in the source/drain regions may be controlled by adjusting a thickness of the first insulation layer 106. In example embodiments, the first insulation layer 106 may be formed using silicon oxide by a CVD process, a PECVD process, or a high density plasma-chemical vapor deposition (HDP-CVD) process. The first insulation layer 106 may have a thickness of about 10 Å to about 30 Å.

Figure 3:
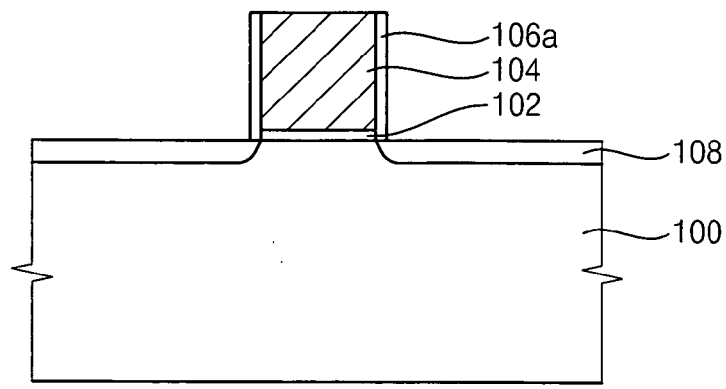

Referring to FIG. 3, the first insulation layer 106 may be etched to form the offset spacer 106a on sidewalls of the gate electrode 104 and the gate insulation layer pattern 102. The offset spacer 106a may be formed by an anisotropic etching process. When the re-oxidation layer is provided on the substrate 100, the re-oxidation layer may be removed from the substrate 100 while partially etching the first insulation layer 106. Impurities may be lightly doped into first portions of the substrate 100 adjacent to the offset spacer 106a to thereby form lightly doped source/drain regions 108 on the first portion of the substrate 100. The offset spacer 106a may prevent or reduce the impurities in the lightly doped source/drain regions 108 from excessively diffusing below the gate electrode 104.

In example embodiments, the off set spacer 106a may be formed after forming the re-oxidation layer. In example embodiments, the off set spacer 106a may be formed without forming the re-oxidation layer. In example embodiments, the re-oxidation layer may be formed without forming the off set spacer 106a. In example embodiments, the re-oxidation layer and the off set spacer 106a may not be provided in order to simplify the manufacturing processes for the semiconductor device.

Figure 4:
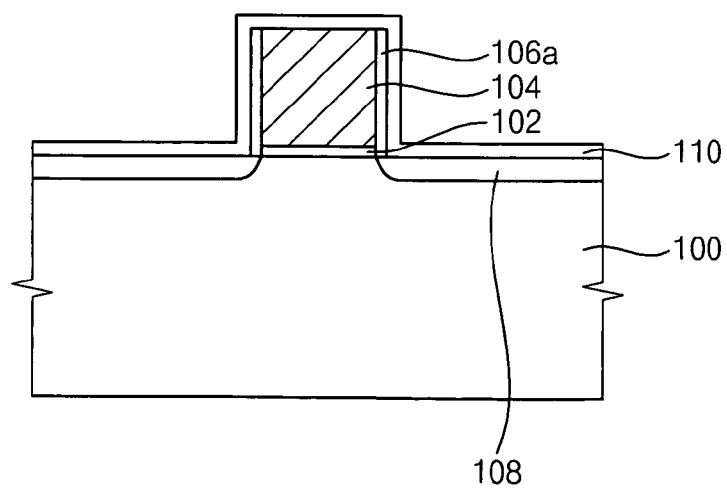

Referring to FIG. 4, an oxide layer 110 may be formed on the substrate 100 to cover the offset spacer 106a and the gate electrode 104. The oxide layer 110 may be formed using silicon oxide. The oxide layer 110 may serve as an etch stop layer, a pad layer for attenuating a stress, or a diffusion barrier layer in subsequent processes. In example embodiments, the oxide layer 110 may be formed using $O_3$-TEOS by a thermal chemical vapor deposition process. Alternatively, the oxide layer 110 may be formed by a PECVD process, or an HDP-CVD process.

When the oxide layer 110 may be formed at a temperature below about 350° C., the oxide layer 110 may not be properly formed on the substrate 100 through the CVD process. When the oxide layer 110 is formed at a temperature above about 500° C., the substrate 100 and the gate electrode 104 may be re-crystallized. Therefore, the oxide layer 110 may be formed at a temperature in a range of about 350° C. to about 500° C.

When the oxide layer 110 has a thickness below about 20 Å, the oxide layer 110 may not adequately serve as the etch stop layer in a subsequent process for etching a nitride layer, and also may not properly serve as the diffusion barrier layer for preventing or reducing diffusion of impurities. When the oxide layer 110 has a thickness about 100 Å, the oxide layer 110 may block implantation of impurities into the substrate 100 in a subsequent process. Thus, the oxide layer 110 may have a thickness in a range of about 20 Å to about 100 Å.

Figure 5:
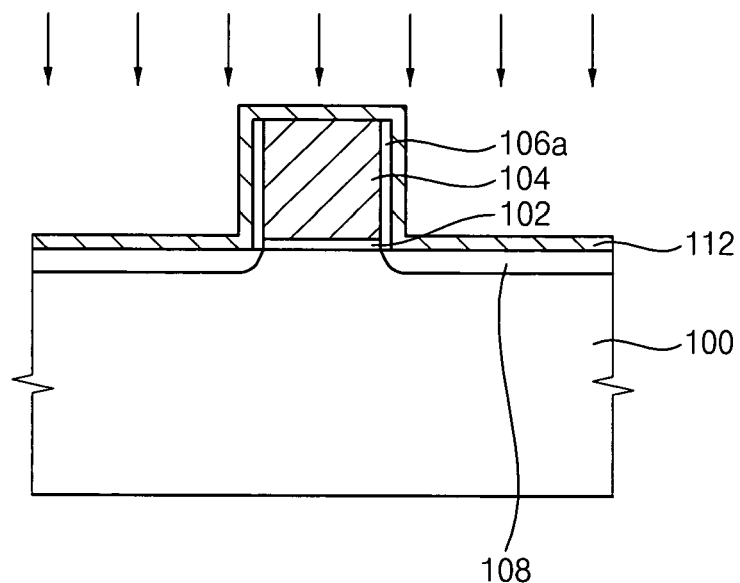

Referring to FIG. 5, a plasma treatment may be performed about the oxide layer 110 using a plasma generated from an inactive gas, an oxygen gas, and/or an ozone gas. These gases may used alone or in a mixture thereof. The oxide layer 110 may be changed into a diffusion barrier layer 112. The inactive gas may include a helium gas, an argon gas, or a nitrogen gas. When the oxide layer 110 is subjected to the plasma treatment, the oxide layer 110 may be changed into the diffusion barrier layer 112, which has a dense structure, and an amount of —OH or —H radicals contained in the diffusion barrier layer 112 may be reduced. The diffusion barrier 112 covering the substrate 100 and the gate electrode 104 may increase an energy required to diffuse the impurities in the gate electrode 104 and/or the lightly doped source/drain regions 108. Thus, the diffusion of the impurities in the gate electrode 104 and/or the lightly doped source/drain regions 108 may be effectively prevented or reduced because of the diffusion barrier layer 112.

In example embodiments, when the oxide layer 110 includes $O_3$-TEOS obtained by the thermal CVD process, the oxide layer 110 may contain numerous —OH radicals. However, when the plasma treatment is executed on the oxide layer 110 of $O_3$-TEOS using the plasma generated from the inactive gas, the amount of —OH radicals contained in the oxide layer 110 may be reduced. When the plasma treatment is carried out relative to the oxide layer 110 of $O_3$-TEOS using the plasma generated from the oxygen gas or the ozone gas, bonds of oxygen atoms may be enhanced in the oxide layer 110, so that the diffusion barrier layer 112 may have a dense structure.

When the plasma treatment is executed at a temperature below about 300° C., the oxide layer 110 may not completely convert into the diffusion barrier layer 112. When the plasma treatment is performed at a temperature above about 700° C., the substrate 100 and the gate electrode 104 having amorphous structures may be re-crystallized. The plasma treatment may be carried out at a temperature in a range of about 300° C. to about 700° C.

When the plasma treatment time is performed for a time below about 1 minute, the oxide layer 110 may not be properly converted into the diffusion barrier layer 112. When the plasma treatment is executed for a time above about 5 minutes, the diffusion barrier layer 112 may be damaged by the plasma, and a processing time may be increased. Therefore, the plasma treatment may be carried out for a time in a range of about 1 minute to about 5 minutes. However, a processing time of the plasma treatment may be adjusted in accordance with the temperature of the plasma treatment and/or the thickness of the oxide layer 110.

Figure 6:
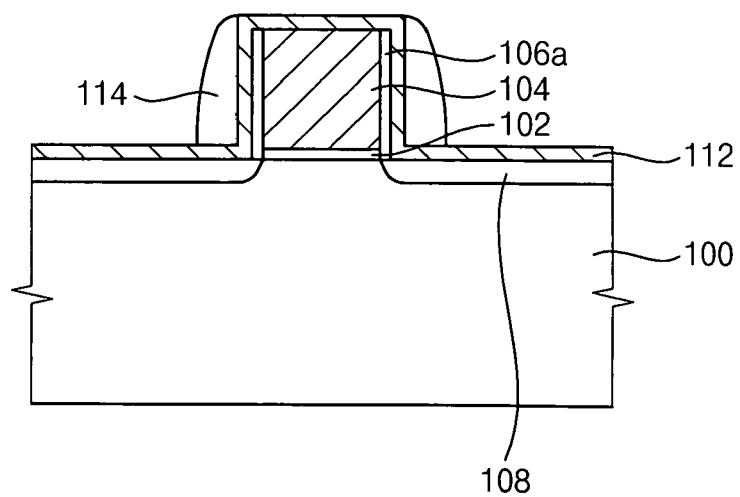

Referring to FIG. 6, a spacer formation layer (not illustrated) may be formed on the diffusion barrier layer 112. The spacer formation layer may be formed using a material having an etching selectivity relative to the diffusion barrier layer 112. For example, the spacer formation layer may be formed using a nitride, e.g., silicon nitride. The spacer formation layer may adjust positions of heavily doped source/drain regions 116 (see FIG. 7) formed on the first portion of the substrate 100 adjacent to the gate electrode 104. In example embodiments, the spacer formation layer may be formed by depositing silicon nitride on the diffusion barrier layer 112 by a PECVD process or a low pressure chemical vapor deposition (LPCVD) process. When the spacer formation layer is formed at a temperature below about 300° C., the spacer formation layer may not be properly formed on the diffusion barrier layer 112. When the spacer formation layer is formed at a temperature above about 500° C., underlying layers may be re-crystallized to cause undesired stress. The spacer formation layer may be formed at a temperature in a range of about 300° C. to about 500° C.

When the spacer formation layer is formed using a plasma, the plasma treatment for the oxide layer 110 and a process for forming the spacer formation layer may be performed in situ. For example, the diffusion barrier layer 112 and the spacer formation layer may be carried out in a chamber without a vacuum break. The spacer formation layer may be partially etched to form a spacer 114 adjacent to the sidewall of the gate electrode 104. The spacer 114 may be positioned on a portion of the diffusion barrier layer 112 formed on the sidewall of the gate electrode 104. The spacer 114 may be formed by an anisotropic etching process. In forming the spacer 114, the diffusion barrier layer 112 positioned on the substrate 100 and the gate electrode 104 may serve as an etch stop layer. After forming the spacer 114, the diffusion barrier layer 112 positioned on the substrate 100 and the gate electrode may be exposed.

Figure 7:
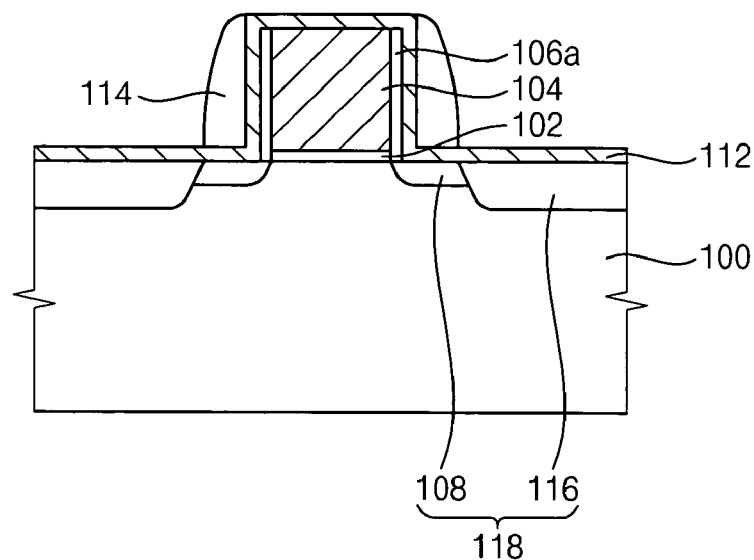

Referring to FIG. 7, impurities may be doped into the first portions of the substrate 100 adjacent to the gate electrode through the diffusion barrier layer 112. Thus, heavily doped source/drain regions 116 may be formed on the first portions of the substrate 100. The heavily doped source/drain regions 116 may include P type impurities, respectively. The impurities may also be doped into an upper portion of the gate electrode 104. Each of the heavily doped source/drain regions 116 may make contact with each lightly doped source/drain regions 108. As a result, source/drain regions 118 having LDD structures may be provided on the first portion of the substrate 100. For example, the source/drain regions 118 may include the lightly doped source/drain regions 108 and the heavily doped source/drain regions 116, respectively. In example embodiments, the substrate 100 may be subject to a rapid thermal process so as to activate the impurities in the source/drain regions 118. The rapid thermal process may be executed at a temperature in a range of about 900° C. to about 1,200° C. under an atmosphere including at least one of a nitrogen gas, an argon gas and a hydrogen gas.

In example embodiments, metal silicide patterns (not illustrated) may be selectively provided on the source/drain regions 118 and the gate electrode 104 by a silicidation process. In forming the metal silicide patterns, the diffusion barrier layer 112 may be removed from the substrate 100 and the gate electrode 104. A metal layer may be formed on the substrate 100 to cover the spacer 114 and the gate electrode 104. The metal layer may be formed using cobalt (Co), nickel (Ni), or titanium (Ti). The metal layer may be subject to a heat treatment to cause reaction between metal in the metal layer and silicon in the substrate 100 and the gate electrode 104. Therefore, the metal silicide patterns may be formed on the source/drain regions 118 and the gate electrode 104. A remaining portion of the metal layer, which does not react with the silicon, may be removed after forming the metal silicide patterns. The metal silicide patterns may reduce resistances of the source/drain regions 118 and the gate electrode 104. However, processes for forming the metal silicide patterns may be omitted to simplify the manufacturing processes for forming the semiconductor device.

In a semiconductor device, e.g., a PMOS transistor, according to example embodiments, P type impurities contained in source/drain regions and a gate electrode may diffuse when a rapid thermal process is performed about a substrate. However, the P type impurities in the source/drain regions may be effectively prevented or reduced from upwardly or downwardly diffusing because of a diffusion barrier layer formed on the substrate to cover the source/drain regions. Further, diffusion of the P type impurities in the gate electrode pattern may also be prevented or reduced from a sidewall and a surface of the gate electrode because the diffusion barrier may cover the sidewall and the surface of the gate electrode. Thus, loss of the impurities included in the gate electrode may be reduced, so that an impurity concentration of the gate electrode may be maintained at a relatively high level. As a result, when a voltage is applied to the gate electrode, gate depletion may be reduced near a bottom face of the gate electrode adjacent to a gate insulation layer pattern, so that a thickness of the gate insulation layer pattern may not be increased. Furthermore, a charge density of a channel region under the gate electrode may increase to improve a current density of the PMOS transistor.

Because the P type impurities in the source/drain regions may be prevented or reduced from diffusing into the substrate, loss of the impurities in the source/drain regions may also be reduced. Therefore, impurity concentrations of the source/drain regions may be maintained at an increased level so that resistances of the source/drain regions may be reduced.

Figure 8:
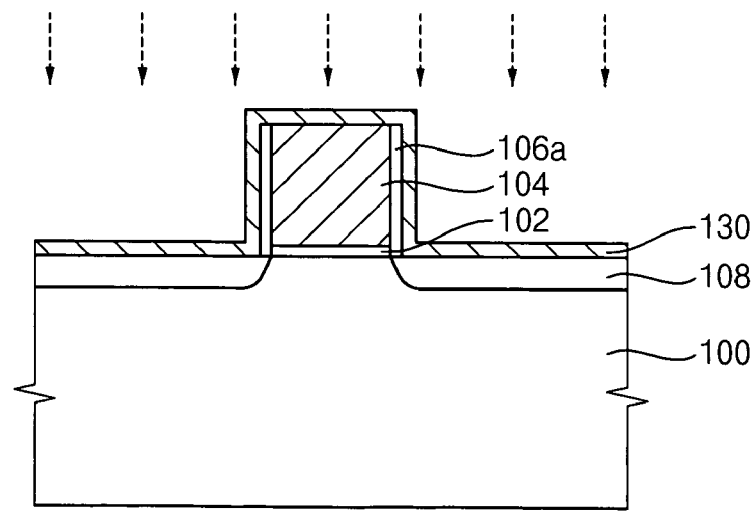

FIG. 8 is a cross sectional view illustrating a method of manufacturing a semiconductor device in accordance with example embodiments. In FIG. 8, the method of manufacturing a PMOS transistor may be substantially the same as that described with reference to FIGS. 1 to 7 except for a process for modifying an oxide layer into a diffusion barrier layer. A gate insulation layer pattern 102, a gate electrode 104, a re-oxidation layer, an offset spacer 106a, and an oxide layer may be formed on a substrate 100. The gate insulation layer pattern 102, the gate electrode 104, the re-oxidation layer, the offset spacer 106a, and the oxide layer may be formed by processes substantially the same as those described with reference to FIGS. 1 to 4.

Referring to FIG. 8, the oxide layer may be changed into the diffusion barrier layer 130 by irradiating an ultraviolet (UV) light onto the oxide layer. For example, the UV light may have a wavelength in a range of about 100 μm to about 500 μm. In example embodiments, the UV light may have a wavelength of about 200 μm to about 300 μm. In example embodiments, the UV light may be irradiated onto the oxide layer for about 1 minutes to about 5 minutes such that the substrate 100 may be maintained at a temperature of about 400° C. to about 600° C. When a UV light irradiation time is less than about 1 minute, the oxide layer may not be completely converted into the diffusion barrier layer 130. When a UV light irradiation time exceeds about 5 minutes, the diffusion barrier layer 130 may be damaged by the UV light, and a processing time may be lengthened.

In example embodiments, the UV light may be irradiated onto the oxide layer in an inactive gas atmosphere. Examples of the inactive gas may include a helium gas, an argon gas, or a nitrogen gas. When a UV light is irradiated onto a silicon oxide layer, molecular bonds in the silicon layer may be broken because energy of the UV light may be higher than a bonding energy of molecules contained in the silicon layer. When the silicon layer is treated with the UV light, bonds of Si—OH, Si—H and N—H having relatively weak bonding energies may be removed from the silicon oxide layer. Thus, the diffusion barrier layer 130 obtained through the UV light irradiation may include bonds of Si—O without —OH radicals or —H radicals. The diffusion barrier layer 130 formed on the substrate 100 from the oxide layer may increase an energy required for the diffusion of P type impurities. As a result, the P type impurities may be prevented or reduced from diffusing into the substrate 100 because of the diffusion barrier layer 130.

In example embodiments, a plasma treatment may be performed about the oxide layer before or after the UV light irradiation. For example, the diffusion barrier layer 130 may be formed from the oxide layer by performing the plasma treatment and the UV light irradiation. The plasma treatment may be carried out using plasma generated from at least one gas of an inactive gas, an oxygen gas and an ozone gas. The PMOS transistor may be provided by performing processes substantially the same as or substantially similar to those described with reference FIGS. 6 and 7. The PMOS transistor may have improved electrical characteristics because the diffusion of the impurities may be effectively prevented or reduced on the gate electrode 104 and source/drain regions 108.

Figure 9:
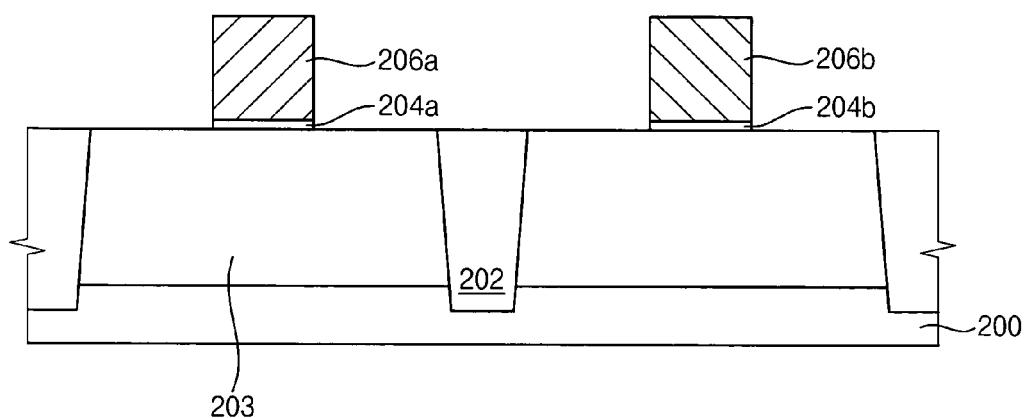

FIGS. 9 to 12 are cross sectional views illustrating a method of manufacturing a CMOS transistor in accordance with example embodiments. In FIGS. 9 to 12, the method of manufacturing the CMOS transistor may be substantially the same as that described with reference to FIGS. 1 to 7 except for processes of forming an NMOS transistor. Referring to FIG. 9, a substrate 200 including a semiconductor material may be prepared. For example, the substrate 200 may include a silicon substrate, a germanium substrate, a silicon germanium substrate, an SOI substrate, or a GOI substrate. The substrate 200 may be divided into a first area where the NMOS transistor is formed and a second area on which a PMOS transistor is formed.

A shallow trench isolation (STI) process may be performed to form an isolation layer 202 on the substrate 200. The isolation layer 202 may define an active region and a field region of the substrate 200. To define a channel region 203 for the NMOS and PMOS transistors, P type impurities may be doped into the first area of the substrate and N type impurities may be doped into the second area of the substrate 200. In example embodiments, after forming a first ion implantation mask (not illustrated) selectively exposing the first area of the substrate 200, the P type impurities may be doped into the first area of the substrate 200. The first ion implantation mask pattern may be removed, and a second ion implantation mask (not illustrated) selectively exposing the second area of the substrate 200 may be provided. The N type impurities may be doped into the second area of the substrate 200. The first and second ion implantation masks may be formed using photoresist, nitride, or oxynitride. Further, the P type impurities may include boron and/or $BF_2$, and the N type impurities may include arsenic and/or phosphor.

Referring now to FIG. 9, a gate insulation layer (not illustrated) may be formed on the substrate 200. The gate insulation layer may be formed by a thermal oxidation process, a CVD process, or an ALD process. A polysilicon layer (not illustrated) used for a gate electrode 206b may be formed on the gate insulation layer. N type impurities may be doped into a first portion of the polysilicon layer positioned in the first area of the substrate 200 whereas P type impurities may be doped into a second portion of the silicon layer formed in the second area of the substrate 200.

In example embodiments, photoresist patterns serving as ion implantation masks may be provided on the first and the second portions of the polysilicon layer before doping of the N type impurities and the P type impurities. The N type impurities may include arsenic and/or phosphor, and the P type impurities may include boron. However, the P type and the N type impurities may be doped into the polysilicon layer in subsequent processes.

The polysilicon layer and the gate insulation layer may be partially etched by a photolithography process to form a first gate insulation layer pattern 204a, a first gate electrode 206a, a second gate insulation layer pattern 204b and a second gate electrode 206b. The first gate insulation layer pattern 204a and the first gate electrode 206a may be located in the first area of the substrate 200. The second gate insulation layer pattern 204b and the second gate electrode 206b may be positioned in the second area of the substrate 200. Therefore, a first gate structure and a second gate structure constituting a conductive layer pattern may be provided in the first and the second areas of the substrate 200. The first gate structure may include the first gate insulation layer pattern 204a and the first gate electrode 206a. The second gate structure may include the second gate insulation layer pattern 204b and the second gate electrode 206b.

Figure 10:
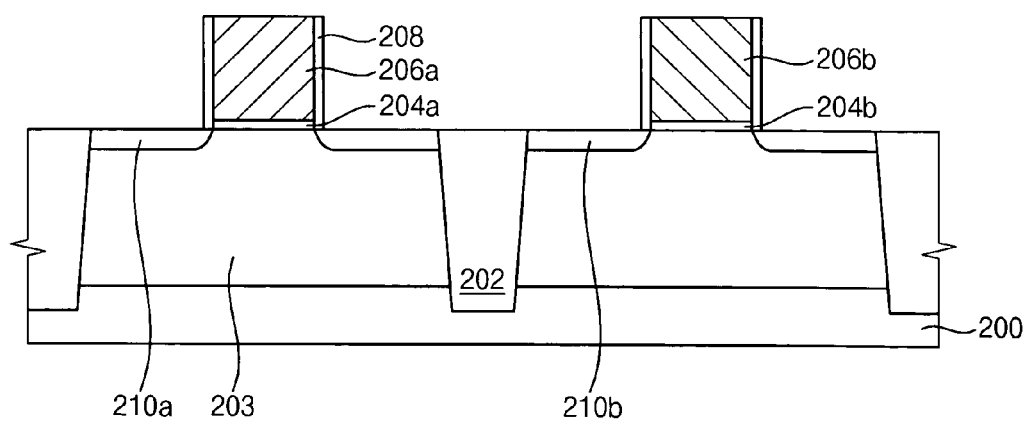

Referring to FIG. 10, a re-oxidation layer (not illustrated) and the offset spacer 208 may be formed on the substrate 200 to cover the first and the second gate electrodes 206a and 206b. The re-oxidation layer and the offset spacer 208 may be formed by processes substantially the same as those described with reference to FIGS. 2 and 3. After forming a third ion implantation mask (not illustrated) selectively exposing the first area of the substrate 200, N type impurities may be doped into a first portion of the first area adjacent to the first gate electrode 206a. Thus, first lightly doped source/drain regions 210a of the NMOS transistor may be formed in the first area. The third ion implantation mask may include photoresist, nitride, or oxynitride. The N type impurities may also be doped into the first gate electrode 206a while implanting the N type into the first portions of the first area.

After forming a fourth ion implantation mask (not illustrated) selectively exposing the second area of the substrate 200, P type impurities may be doped into a second portion of the second area of the substrate 200. Second lightly doped source/drain regions 210b of the PMOS transistor may be provided in the second area. The fourth ion implantation mask may also include photoresist, nitride, or oxynitride. Additionally, the P type impurities may also be doped into the second gate electrode 206b in forming second lightly doped source/drain regions 210b.

Figure 11:
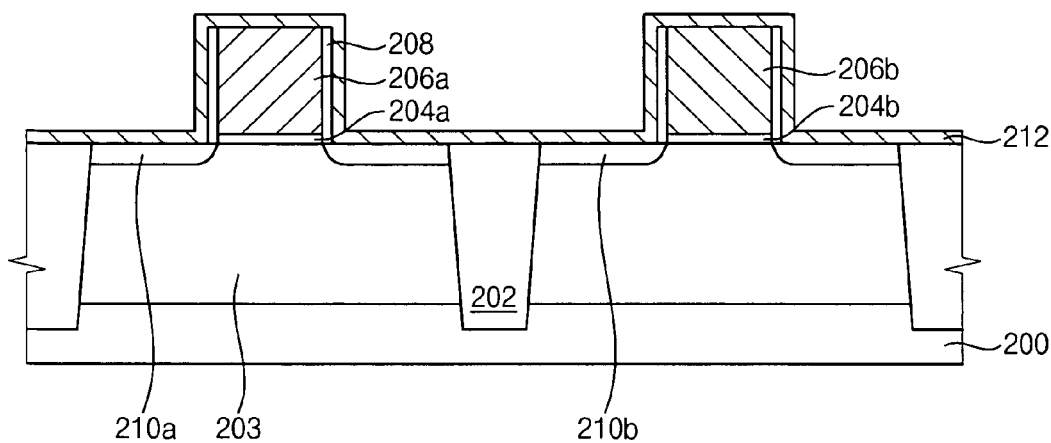

Referring to FIG. 11, an oxide layer (not illustrated) may be formed on the substrate 200 to cover the first gate electrode 206a, the second gate electrode 206b and the offset spacer 208. By a plasma treatment and/or a UV light irradiation substantially the same as those described with reference to FIGS. 5 and 8, the oxide layer may be changed into a diffusion barrier layer 212. The plasma treatment process may be carried out using a plasma generated from at least one of an inactive gas, an oxygen gas and an ozone gas. Examples of the inactive gas may include a helium gas, an argon gas, or a nitrogen gas. The UV light relative to the oxide layer may be performed for about 1 minute to about 5 minutes while maintaining a temperature of the substrate 200 in a range of about 400° C. to about 600° C.

Figure 12:
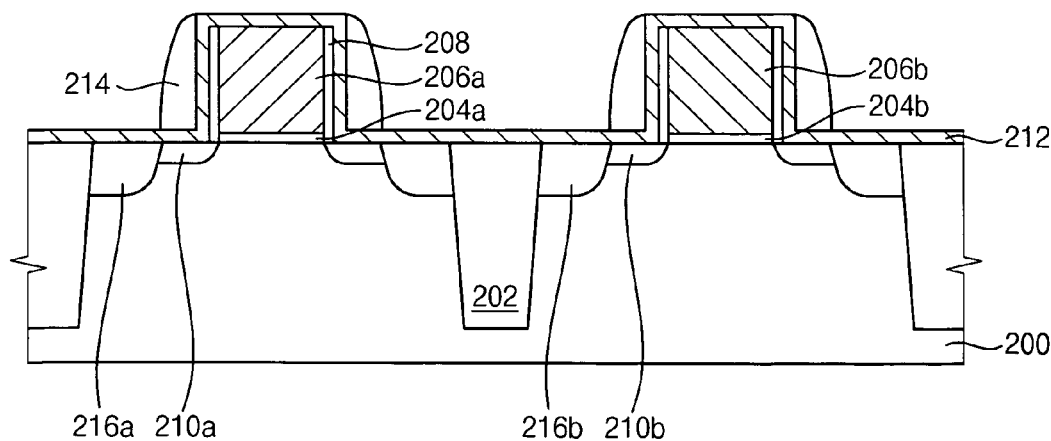

Referring to FIG. 12, an insulation layer may be formed on the diffusion barrier layer 212, and the insulation layer may be partially etched to form a spacer 214 on portions of the diffusion barrier layer 212 positioned on sidewalls of the first and the second gate electrodes 206a and 206b. The spacer 214 may be formed by an anisotropic etching process. After forming a fifth ion implantation mask (not illustrated) selectively exposing the first area of the substrate 200, N type impurities may be doped into the first portion of the first area. First heavily doped source/drain regions 216a of the NMOS transistor may be formed near the first lightly doped source/drain regions 201a. The first heavily doped source/drain regions 216a may make contact with the first lightly doped source/drain regions 210a, respectively. The N type impurities may be additionally doped into the first gate electrode 206a while forming the first heavily doped source/drain regions 216a.

After forming a sixth ion implantation mask (not illustrated) selectively exposing the second area of the substrate 200, P type impurities may be doped into the second portions of the second area. Second heavily doped source/drain regions 216b of the PMOS transistor may be provided near the second lightly doped source/drain regions 210b. Each of the second heavily doped source/drain regions 216b may make contact with each second lightly doped source/drain region 210b. Further, the P type impurities may also be doped into the second gate electrode 206b in forming the second heavily doped source/drain regions 216b. Therefore, first source/drain regions and second source/drain regions may be provided in the first area and the second area, respectively. The first source/drain regions may include the first lightly doped source/drain regions 201a and the first heavily doped source/drain regions 216a. The second source/drain regions may include the second lightly doped source/drain regions 201b and the second heavily doped source/drain regions 216b. In example embodiments, impurities included in the first and the second source/drain region may be activated by a rapid thermal process. As a result, the CMOS transistor including the first and the second source/drain regions having LDD structures may be provided on the substrate 200. Impurities contained in the first and the second source/drain regions and the first and the second gate electrodes may be efficiently prevented or reduced from diffusing upwardly or downwardly because of the diffusion barrier layer 212, so that the CMOS transistor may have improved performance.

As described above, the diffusion of impurities may be restricted by the diffusion barrier layer, so that the semiconductor device, for example, a transistor, may have improved performance by simplified manufacturing processes. The transistor manufactured by the method according to example embodiments may prevent or reduce a gate depletion phenomenon and may reduce resistances of source/drain regions. Therefore, an operation current of the transistor may be increased, and an operation speed thereof may also be improved. Further, a saturation current of the transistor may be increased. As a result, operational characteristics and reliability of the semiconductor device may be considerably improved.

The foregoing is illustrative of example embodiments and is not to be construed as limiting thereof. Although a few example embodiments have been described, those skilled in the art will readily appreciate that many modifications may be possible in example embodiments without materially departing from the novel teachings and advantages of example embodiments. Accordingly, all such modifications may be intended to be included within the scope of example embodiments as defined in the claims. In the claims, means-plus-function clauses may be intended to cover the structures described herein as performing the recited function and not only structural equivalents but also equivalent structures. Therefore, it is to be understood that the foregoing is illustrative of example embodiments and is not to be construed as limited to the specific example embodiments disclosed, and that modifications to the disclosed example embodiments, as well as other example embodiments, may be intended to be included within the scope of the appended claims. Example embodiments may be defined by the following claims, with equivalents of the claims to be included therein.

What is claimed is:

1. A method of manufacturing a semiconductor device, comprising:
    forming a conductive layer pattern on a substrate;
    forming an oxide layer on the substrate and the conductive layer pattern;
    forming a diffusion barrier layer on the oxide layer by treating the oxide layer to increase an energy for diffusion of impurities, wherein forming the diffusion barrier layer includes an ultraviolet (UV) light irradiation; and
    implanting the impurities into the conductive layer pattern and a portion of the substrate adjacent to the conductive layer pattern through the diffusion barrier layer to form an impurity region adjacent to the conductive layer pattern.

2. The method of claim 1, wherein the oxide layer has a thickness in a range of about 20 Å to about 100 Å, and the impurities are P type impurities.

3. The method of claim 1, wherein forming the diffusion barrier layer includes a plasma treatment using a plasma generated from at least one selected from the group consisting of a hydrogen gas, a helium gas, a nitrogen gas, an argon gas, an oxygen gas and an ozone gas.

4. The method of claim 3, wherein the plasma treatment is performed at a temperature in a range of about 300° C. to about 700° C. for about 1 minute to about 5 minutes.

5. The method of claim 1, wherein the UV light irradiation is performed at a temperature in a range of about 400° C. to about 600° C. under an inactive gas atmosphere.

6. The method of claim 1, wherein forming the diffusion barrier layer further includes a plasma treatment.

7. The method of claim 1, further comprising:
    forming a spacer formation layer on the diffusion barrier layer; and
    forming a spacer on a portion of the diffusion barrier layer positioned on a sidewall of the conductive layer pattern by anisotropically etching the spacer formation layer using the diffusion barrier layer as an etch stop layer.

8. The method of claim 7, wherein forming the diffusion barrier layer and forming the spacer formation layer are performed in situ.

9. The method of claim 8, further comprising:
    forming a lightly doped impurity region at the portion of the substrate by doping P type impurities into the portion of the substrate before forming the oxide layer.

10. The method of claim 9, further comprising:
    forming an offset spacer on the sidewall of the conductive layer pattern to adjust a position of the lightly doped impurity region.

11. The method of claim 1, further comprising:
    activating the impurities in the impurity region by thermally treating the substrate having the impurity region.

12. The method of claim 1, wherein the conductive layer pattern is a first gate structure and a second gate structure in a first region and a second region of the substrate, the oxide layer is a silicon oxide layer covering the first and the second gate structures, and implanting the impurities includes:
    forming a first impurity region in the first region of the substrate by implanting N type impurities into the first region of the substrate adjacent to the first gate structure,
    forming a second impurity region in the second region of the substrate by implanting P type impurities into the second region of the substrate adjacent to the second gate structure, and wherein, before implanting the impurities, the method further comprises:
    forming spacers on portions of the diffusion barrier layer positioned on sidewalls of the first and the second gate structures.

13. The method of claim 12, wherein forming the diffusion barrier layer includes a plasma treatment using a plasma generated from at least one selected from the group consisting of a hydrogen gas, a helium gas, a nitrogen gas, an argon gas, an oxygen gas and an ozone gas.

14. The method of claim 12, wherein forming the diffusion barrier layer further includes a plasma treatment.

15. The method of claim 12, wherein each of the first and the second gate structures has a stacked construction that includes a gate insulation layer pattern and a gate electrode.

16. The method of claim 12, further comprising:
    forming a first lightly doped impurity region by implanting N type impurities into the substrate adjacent to the first gate structure; and
    forming a second lightly doped impurity region by implanting P type impurities into the substrate adjacent to the second gate structure.

17. The method of claim 16, further comprising:
    forming offset spacers on sidewalls of the first and the second gate structures to adjust positions of the first and the second lightly doped impurity regions.

18. The method of claim 12, further comprising:
    activating impurities in the first and the second impurity regions by thermally treating the substrate having the first and the second impurity regions.

* * * * *